United States Patent
Tanabe

(10) Patent No.: US 7,342,245 B2
(45) Date of Patent: Mar. 11, 2008

(54) ORGANIC SEMICONDUCTOR DEVICE

(75) Inventor: Takahisa Tanabe, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 185 days.

(21) Appl. No.: 10/532,967

(22) PCT Filed: Oct. 24, 2003

(86) PCT No.: PCT/JP03/13615

§ 371 (c)(1),
(2), (4) Date: Nov. 15, 2005

(87) PCT Pub. No.: WO2004/040657

PCT Pub. Date: May 13, 2004

(65) Prior Publication Data

US 2006/0197084 A1    Sep. 7, 2006

(30) Foreign Application Priority Data

Oct. 30, 2002    (JP)    ............... 2002-315828

(51) Int. Cl.
*H01L 29/08*    (2006.01)
(52) U.S. Cl. ........................ 257/40; 257/350
(58) Field of Classification Search ............ 257/40, 257/350, 351, 369, 382
See application file for complete search history.

(56) References Cited

U.S. PATENT DOCUMENTS

| 5,625,199 | A | 4/1997 | Baumbach et al. |
| 5,801,398 | A | 9/1998 | Hebiguchi |
| 6,136,702 | A | 10/2000 | Chandross et al. |
| 6,150,688 | A | 11/2000 | Maeda et al. |
| 6,284,562 | B1 | 9/2001 | Batlogg et al. |
| 2006/0197084 | A1 * | 9/2006 | Tanabe ............... 257/57 |

FOREIGN PATENT DOCUMENTS

| EP | 0 962 984 A2 | 12/1999 |
| EP | 1 102 335 A2 | 5/2001 |
| JP | 4-86891 | 3/1992 |
| JP | 6-89905 | 3/1994 |
| JP | 10-135481 | 5/1998 |
| JP | 2000-124462 | 4/2000 |
| WO | WO 01/08242 A1 | 2/2001 |

OTHER PUBLICATIONS

A. Dodabalapur et al., "Complementary Circuits With Organic Transistors," Applied Physics Letters, vol. 69, No. 27, Dec. 30, 1996, pp. 4227-4229.

* cited by examiner

*Primary Examiner*—Mark V. Prenty
(74) *Attorney, Agent, or Firm*—Drinker Biddle & Reath LLP

(57) ABSTRACT

An organic semiconductor device includes at least p-type and n-type channel organic semiconductor elements. Each organic semiconductor element includes a pair of a source electrode and a drain electrode which are facing each other, an organic semiconductor layer deposited between the source electrode and the drain electrode such that a channel can be formed therebetween, and a gate electrode which applies a voltage through a gate insulating layer to the organic semiconductor layer provided between the source electrode and the drain electrode. The source electrode and the drain electrode of the p-type channel organic semiconductor element are made of materials having values of work function higher than those of the source electrode and the drain electrode of the n-type channel organic semiconductor element respectively.

8 Claims, 2 Drawing Sheets

ORGANIC SEMICONDUCTOR DEVICE

TECHNICAL FIELD

The present invention relates to an organic semiconductor device which comprises an organic semiconductor layer of an organic compound.

BACKGROUND ART

In the field of organic semiconductors which utilizes an organic compound with a carrier mobility, application of a voltage across the organic semiconductor thin-film increases carrier density, which permits flow of an electrical current between a pair of electrodes provided on an organic semiconductor thin-film. Thus, researches have been conducted on organic transistors, which permits a gradual utilization of the organic semiconductors in technical fields such as transmitting, processing, and recording and displaying of information. In such technical fields, an electrical signal is used for controlling electron carriers and hole carriers within the organic semiconductor at a junction interface between a metal and an organic semiconductor or between one organic semiconductor and another organic semiconductor.

For example, there is a structure of an organic MOS-TFT using an organic semiconductor thin-film in which a gate electrode, a gate insulating layer, a source electrode and a drain electrode, and an organic semiconductor layer are formed on a substrate. Since an enhancement of the carrier mobility is necessary to increase a working frequency of the organic transistor, a layered structure comprising the organic semiconductor layer by using pentacene or the like, and the gate insulating layer by using PMMA, cyclohexene or the like is proposed. Materials used for the electrodes are Pd, Au and the like for both the source electrode and the drain electrode.

In convention, the same material is commonly used for the source and drain electrodes of the p-type and n-type channel organic semiconductor elements of complementary organic semiconductor devices (for example, see Bell Lab. Nature Vol. 403, 521, 2000).

Such conventional organic semiconductor device has a drawback such that the right materials have not been put in the right places of the p-type and n-type channel organic semiconductor elements concerning the work function, a sufficient ohmic contact is not obtained between the organic semiconductor layer and each electrode, so that there are an increase of driving voltage for the organic semiconductor element and a nonlinear current-voltage characteristics.

DISCLOSURE OF INVENTION

It is therefore an object of the present invention to provide an organic semiconductor device having excellent electric properties.

An organic semiconductor device according to the present invention includes:

at least p-type and n-type channel organic semiconductor elements each including a pair of a source electrode and a drain electrode which are facing each other, an organic semiconductor layer deposited between the source electrode and the drain electrode such that a channel can be formed therebetween, a gate electrode which applies a voltage through a gate insulating layer to the organic semiconductor layer provided between the source electrode and the drain electrode;

wherein the source electrode and the drain electrode of the p-type channel organic semiconductor are made of materials having values of work function higher than those of the source electrode and the drain electrode of the n-type channel organic semiconductor respectively.

DETAILED DESCRIPTION OF THE INVENTION

Embodiments of organic transistors as examples of complementary organic semiconductor devices according to the present invention will be described with reference to the drawings.

Figure 1:
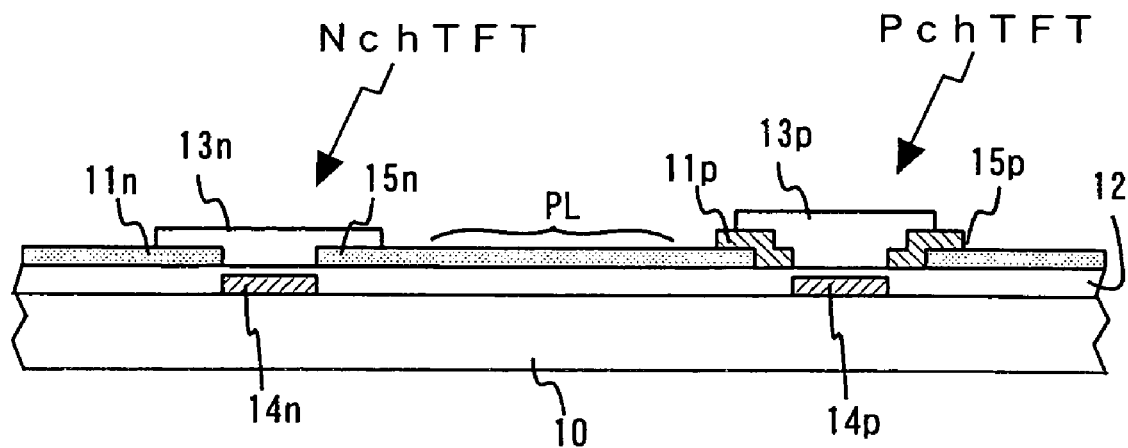
FIG. 1 is across sectional view showing an organic transistor according to an embodiment of the present invention.

FIG. 1 shows an organic semiconductor device of a first embodiment which includes an insulative substrate 10 made of an insulator such as plastics, glass or the like, a p-type channel organic semiconductor element PchTFT formed on the substrate, an n-type channel organic semiconductor element NchTFT formed on the substrate, and a wiring line PL connecting these elements one another.

The p-type channel organic semiconductor element PchTFT includes: a gate electrode 14p formed on the substrate 10; a gate insulating layer 12 formed on the substrate 10 and the gate electrode 14p to cover the gate electrode; a pair of a source electrode 11p and a drain electrode 15p (hereinafter, referring to as p-side source and drain electrodes respectively) formed on the gate insulating layer 12 so as to face each other over the gate electrode 14p; and an organic semiconductor layer 13p formed on the gate insulating layer 12 to be deposited between the p-side source and drain electrodes 11p, 15p such that a channel can be formed therebetween. The gate electrode 14 may apply a voltage through the gate insulating layer 12 to the organic semiconductor layer 13p provided between the p-side source and drain electrodes lip, 15p. The n-type channel organic semiconductor element NchTFT connected to the p-type channel organic semiconductor element PchTFT includes: a gate electrode 14n formed on the substrate 10; the gate insulating layer 12 formed on the substrate 10 and the gate electrode 14n to cover the gate electrode; a pair of a source electrode 11n and a drain electrode 15n (hereinafter, referring to as n-side source and drain electrodes respectively) formed on the gate insulating layer 12 so as to face each other over the gate electrode 14n; and an organic semiconductor layer 13n formed on the gate insulating layer 12 to be deposited between the n-side source and drain electrodes 11n, 15n such that a channel can be formed therebetween. The gate electrode 14n may apply a voltage through the gate insulating layer 12 to the organic semiconductor layer 13n provided between the n-side source and drain electrodes 11n, 15n. Each organic semiconductor layer is made of an organic compound that has a capability to transport holes (or electrons) when a voltage is applied thereto. The organic semiconductor layer may also have a multilayered structure which comprises thin-films of organic compounds each having a carrier transporting capability.

The wiring line PL is made of the same material of which the n-side drain electrode 15n is made and formed at the same time. The p-side source and drain electrodes 11p, 15p are made of materials having values of work function higher than those of the n-side source and drain electrodes 11n, 15n. That is, high work function materials such as palladium (the work function $\Phi$ of Pd=4.8 eV), platinum (the work function $\Phi$ of Pt=5.3 eV), gold (the work function $\Phi$ of Au=4.6 eV) and the like and an alloy including at least one of them are used for the p-side source and drain electrodes 11p, 15p. Comparatively low work function materials such as chromium (the work function $\Phi$ of Cr=4.5 eV), aluminum (the work function $\Phi$ of Al=3.7 eV), molybdenum (the work function $\Phi$ of Mo=4.3 eV), tantalum (the work function $\Phi$ of Ta=4.1 eV) and the like and an alloy including at least one of them are used for the n-side source and drain electrodes 11n, 15n and the pattern of wiring lines including the wiring line PL and the like, such materials being used for the pattern of the wiring lines for TFT.

It is preferable that materials each having a work function value close to an ionization potential of the p-type organic semiconductor layer 13p are used for the p-side source and drain electrodes 11p, 15p respectively. In addition, it is preferable that materials each having a work function value close to an electron affinity of the n-type organic semiconductor layer 13n are used for the n-side source and drain electrodes 11n, 15n respectively.

In the embodiment shown in FIG. 1 of the both bottom-contact type organic transistors, the p-type channel organic semiconductor element PchTFT is made of an organic compound having a carrier (hole) mobility, for example, pentacene (p-type organic semiconductor). Fused ring compounds such as anthracene or tetracene can be used for the p-type organic semiconductor in addition to pentacene having a higher carrier mobility.

The p-type channel organic semiconductor element having a hole transporting property can be achieved by using pentacene as the organic semiconductor layer. Whereas, when the carriers are electrons, electron transporting materials (n-type) are necessary such that the electrons can be moved therethrough. There are aluminum quinolate complex (tris-8-hydoxyqunoline aluminum) or the like as the electron transporting materials. The n-type channel organic semiconductor element having an electron transporting property can be achieved by using an electron transporting materials as the n-type organic semiconductor layer 13n. Metal, alloy or the like including at least one of materials each having a work function value close to an electron affinity of the n-type organic semiconductor layer 13n are used for the n-side source and drain electrodes 11n, 15n respectively. The work function of the material included in the n-side source and drain electrodes 11n, 15n is preferably within a range of ±1 eV, and more preferably within a range of ±0.5 eV with a center of the range corresponding to the electron affinity of the organic semiconductor to be utilized.

The organic semiconductor layer used for the organic semiconductor device according to the present invention may be deposited by a method such as vacuum deposition, spin coating, sputtering, or a sol-gel method. A deposition method for the source electrode and the drain electrode can be selected from the methods of vapor deposition, sputtering, and CVD (Chemical Vapor Deposition). Among the methods, the sputtering is preferable from the viewpoints of easy using efficiency of material, stability of formation ratio in electrode alloying, and simplicity of the deposition facility.

The fabrication process of organic semiconductor device of the first embodiment is roughly as follows.

(1) A first pattern of wiring lines including gate electrodes 14p, 14n to be included in planned two semiconductor elements is formed on the substrate 10.

(2) A common gate insulating layer 12 is formed on the substrate 10 and the gate electrodes 14p, 14n to cover the gate electrodes. The gate insulating layer 12 will electrically insulate the gate electrodes from planned source and drain electrodes in the planned p-type and n-type channel organic semiconductor elements PchTFT, NchTFT.

(3) A second pattern of wiring lines including n-side source and drain electrodes 11n, 15n and a wiring lines PL is formed on the gate insulating layer 12 except over the gate electrodes 14p, 14n. The n-side source and drain electrodes 11n, 15n and the wiring lines PL are made of the same material. The n-side source and drain electrodes 11n, 15n face each other over the gate electrode 14n.

(4) A pattern including p-side source and drain electrodes 11p, 15p is formed on the gate insulating layer 12 so as to face each other over the gate electrode 14p and to be connected to the wiring lines PL at the edges adjacent to the gate electrode 14p.

(5) Organic semiconductor layers of the p-type and n-type 13p, 13n are formed on the gate insulating layer 12 to be deposited between the respective source and drain electrodes.

Figure 2:
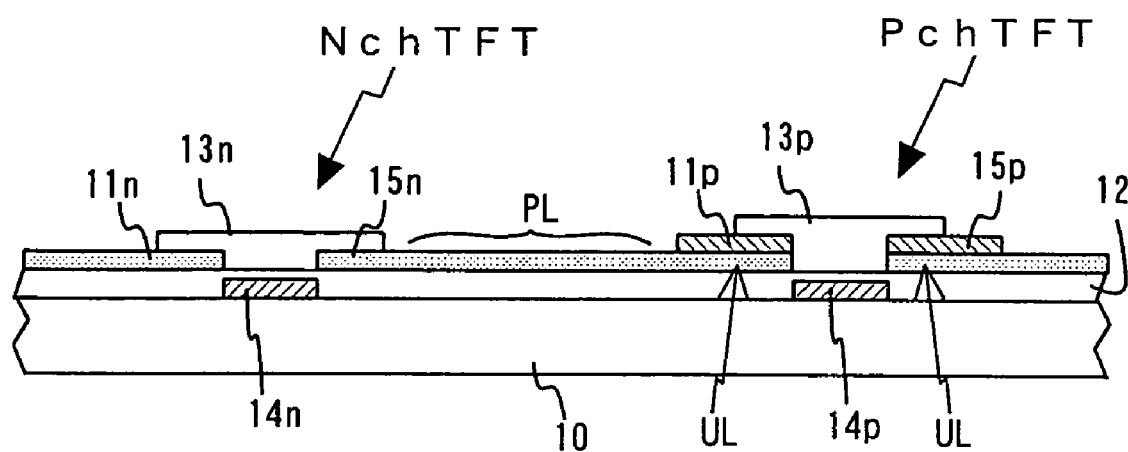
FIGS. 2 and 3 are cross sectional views each showing an organic transistor according to another embodiment of the present invention.

It is noted that, in the first embodiment, the p-side source and drain electrodes are formed after the formation of the second pattern of the wiring lines (3). Besides, as shown in FIG. 2, there may be provided with under-layer portions UL for such electrodes beneath the p-side source and drain electrodes 11p, 15p in the p-type organic semiconductor layer 13p. The under-layer portions UL are formed of the same materials during the patterning (3) of wiring lines including n-side source and drain electrodes 11n, 15n and a wiring lines PL. After that, the p-side source and drain electrodes 11p, 15p are formed on the under-layer portions UL, so that two-layer source and drain electrodes are achieved.

Further, it is noted that the n-side source and drain electrodes and the pattern of the wiring lines are formed of the same material in the embodiments shown in FIGS. 1 and 2. In addition, the pattern of the wiring lines including the wiring lines PL and the p-side source and drain electrodes are formed of the same material at the same time.

Figure 3:
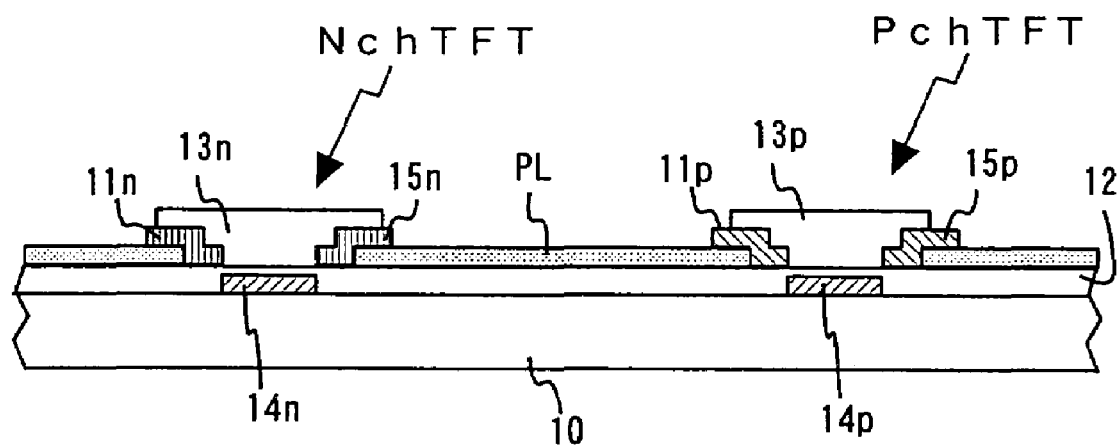

Moreover, as shown in FIG. 3, the source and drain electrodes materials may be formed of individual materials for the respective type organic semiconductor elements, and the electrodes materials may be different from that of the pattern of the wiring lines including the wiring lines PL. This structure enable to use materials having high specific resistance other than metal such as conductive polymer materials and the like for the source and drain electrodes. A conductive paste including silver (Ag) micron particles and a binder such as polyester, thermosetting epoxy resin and the like may be used for materials of pattern of the wiring lines including the wiring lines PL preferably. With the conductive paste the substrate may be coated through a printing method with the predetermined pattern of the wiring lines. Then the substrate is heated with an oven with internal air circulation to harden the conductive paste, so that the pattern of the wiring lines including the wiring lines PL is obtained easily.

In the present embodiment, for the n-type channel organic semiconductor element and the p-type channel organic semiconductor element, the source and drain electrodes can be individually formed of materials having work functions pertinent to the source and drain electrodes of the n-side and p-side. Therefore, an excellent ohmic contact is obtained between the organic semiconductor layer and each electrode, so that a decrease of driving voltage for the organic semiconductor element and a linear electric characteristic are achieved. The organic semiconductor device according to the present embodiment may be utilized for a circuit for driving pixels in the display apparatus such as an LCD, an organic electroluminescence device and the like. In the case that at least one organic transistor according to the present invention, necessary elements such as capacitors, pixel electrodes and the like are formed on a common substrate, an active drive type display apparatus may be realized by using the organic MOS-TFT according to the present invention.

Figure 4:
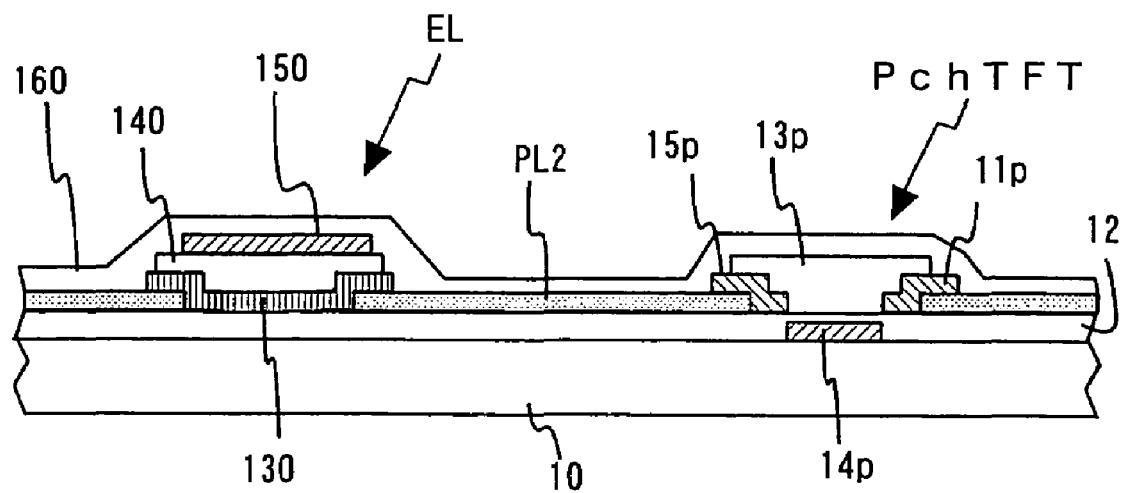
FIG. 4 is a cross-sectional view showing substrate structure of a display apparatus when an organic transistor according to another embodiment of the present invention is adapted to a TFT-organic electroluminescence display apparatus.

Concretely, as shown in FIG. 4, the p-type channel organic semiconductor element PchTFT may be connected to the organic electroluminescence element EL on the common substrate 10. The drain electrode 15p of PchTFT is connected to a transparent electrode 130 of the organic electroluminescence element El with the second wiring line PL2 made of a conductive Ag paste for example. In the organic electroluminescence element EL, the substrate 10 is transparent and the transparent electrode 130 is made of indium tin oxide (ITO). On the transparent electrode 130, a hole injection layer, a hole transport layer, a light-emitting layer and an electron injection layer are layered in turn, so that these constitute an organic functional layer 140. Further, a metal electrode 150 of metal such as Al and the like is formed on the functional layer 140 so as to face the transparent electrode 130. The p-type channel organic semiconductor element PchTFT and the organic electroluminescence element EL are covered with a sealing film 160. Here is one example of structures of the organic electroluminescence element, the organic electroluminescence element is not limited by this example. The invention may be adapted to any structure and materials of the organic electroluminescence element. Over the common substrate, the second wiring line PL2 is connected to one of the gate electrodes of the p-type or n-type channel organic semiconductor element and the source and drain electrodes, and also the second wiring line はthe organic electroluminescence device is connected to the organic electroluminescence display apparatus comprising pixels including the organic electroluminescence devices as light-emitting portions.

The invention claimed is:

1. An organic semiconductor device comprising:
  at least p-type and n-type channel organic semiconductor elements each including
    a pair of a source electrode and a drain electrode which are facing each other,
    an organic semiconductor layer deposited between the source electrode and the drain electrode such that a channel can be formed therebetween,
    a gate electrode which applies a voltage through a gate insulating layer to the organic semiconductor layer provided between the source electrode and the drain electrode; and
  a wiring line which electrically connects said organic semiconductor elements, the wiring line being made of a material of one of the source and drain electrodes of the p-type channel organic semiconductor element,
  wherein the source electrode and the drain electrode of the p-type channel organic semiconductor are made of materials having values of work function higher than those of the source electrode and the drain electrode of the n-type channel organic semiconductor respectively,
  wherein the organic semiconductor layers of the p-type and n-type channel organic semiconductor elements are made of p-type and n-type organic semiconductors respectively, and
  wherein the source electrode and the drain electrode of the p-type channel organic semiconductor element have values equal or close to an ionization potential of the p-type organic semiconductor layer.

2. The organic semiconductor device according to claim 1, wherein the source electrode and the drain electrode of the n-type channel organic semiconductor element have values equal or close to an electron affinity of the n-type organic semiconductor layer.

3. The organic semiconductor device according to claim 1, further comprising a second wiring line to be electrically connected to one of the gate electrode, the source and drain electrodes of the p-type or n-type channel organic semiconductor element at one end, the second wiring line being electrically connected to an organic electroluminescence element.

4. The organic semiconductor device according to claim 1, wherein the wiring line electrically connects one of the source and drain electrodes of the p-type channel organic semiconductor element to one of the source and drain electrodes of the n-type channel organic semiconductor element.

5. An organic semiconductor device comprising:
  at least p-type and n-type channel organic semiconductor elements each including
    a pair of a source electrode and a drain electrode which are facing each other,
    an organic semiconductor layer deposited between the source electrode and the drain electrode such that a channel can be formed therebetween,
    a gate electrode which applies a voltage through a gate insulating layer to the organic semiconductor layer provided between the source electrode and the drain electrode; and
    a wiring line which electrically connects said organic semiconductor elements, the wiring line being made of a material of one of the source and drain electrodes of the n-type channel organic semiconductor element,
  wherein the source electrode and the drain electrode of the p-type channel organic semiconductor are made of materials having values of work function higher than those of the source electrode and the drain electrode of the n-type channel organic semiconductor respectively,
  wherein the organic semiconductor layers of the p-type and n-type channel organic semiconductor elements are made of p-type and n-type organic semiconductors respectively, and
  wherein the source electrode and the drain electrode of the p-type channel organic semiconductor element have values equal or close to an ionization potential of the p-type organic semiconductor layer.

6. The organic semiconductor device according to claim 5, wherein the source electrode and the drain electrode of the n-type channel organic semiconductor element have values equal or close to an electron affinity of the n-type organic semiconductor layer.

7. The organic semiconductor device according to claim 5, further comprising a second wiring line to be electrically connected to one of the gate electrode, the source and drain electrodes of the p-type or n-type channel organic semiconductor element at one end, the second wiring line being electrically connected to an organic electroluminescence element.

8. The organic semiconductor device according to claim 5, wherein the wiring line electrically connects one of the source and drain electrodes of the p-type channel organic semiconductor element to one of the source and drain electrodes of the n-type channel organic semiconductor element.

* * * * *